(12) United States Patent
Deshpande

(10) Patent No.: US 9,326,384 B2
(45) Date of Patent: Apr. 26, 2016

(54) PROCESS TO PRODUCE CONFORMAL NANO-COMPOSITE COATING FOR MITITGATION OF MANUFACTURING DEFECTS USING CHEMICAL VAPOR DEPOSITION AND NANO-STRUCTURES

(71) Applicant: The United States of America Navy as represented by the Secretary of the Navy, Washington, DC (US)

(72) Inventor: Nishkamraj Deshpande, Novi, MI (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 222 days.

(21) Appl. No.: 14/227,391

(22) Filed: Mar. 27, 2014

(65) Prior Publication Data

US 2014/0342097 A1 Nov. 20, 2014

Related U.S. Application Data

(60) Provisional application No. 61/815,021, filed on Apr. 23, 2013.

(51) Int. Cl.
*H05K 3/00* (2006.01)
*H05K 3/22* (2006.01)
*H05K 3/28* (2006.01)

(52) U.S. Cl.
CPC *H05K 3/28* (2013.01); *H05K 3/284* (2013.01); *H05K 2201/0251* (2013.01); *H05K 2201/0257* (2013.01); *H05K 2201/0769* (2013.01); *H05K 2201/09872* (2013.01)

(58) Field of Classification Search
None
See application file for complete search history.

(56) References Cited

U.S. PATENT DOCUMENTS

| 2008/0001237 A1* | 1/2008 | Chang | H01L 21/28088 257/411 |
| 2008/0185173 A1* | 8/2008 | Bedinger | H01L 23/3192 174/258 |

OTHER PUBLICATIONS

Verdi, "Lead Free Electronics, Tin Whisker Risks, and Mitigation Techniques", ACI Technologies, (Mar. 11, 2009).*

* cited by examiner

*Primary Examiner* — Lisha Jiang
(74) *Attorney, Agent, or Firm* — Christopher A. Monsey

(57) ABSTRACT

The present invention relates application of conformal coatings made up of nano-fiber, nano-particle, and/or nano-capsule materials to be applied on electrical component parts in general and printed circuit boards (PCB) in particular. A conformal coating material, such as Parlyne, can be combined with nano-materials to produce desired results. Benefits of this invention include enhancement of conventional conformal coatings performance in terms of properties such as mechanical, electrical, magnetic and in particular to prevent or obstruct the growth of tin whiskers or any other manufacturing defect that can develop on the surface of a PCB.

20 Claims, 7 Drawing Sheets

Formation of PPX films by means of CVD process

PROCESS TO PRODUCE CONFORMAL NANO-COMPOSITE COATING FOR MITITGATION OF MANUFACTURING DEFECTS USING CHEMICAL VAPOR DEPOSITION AND NANO-STRUCTURES

CROSS-REFERENCE TO RELATED APPLICATIONS

The present application claims priority to U.S. Provisional Patent Application Ser. No. 61/815,021, filed Apr. 23, 2013, entitled "PROCESS TO PRODUCE CONFORMAL NANO-COMPOSITE COATING FOR MITITGATION OF MANUFACTURING DEFECTS USING CHEMICAL VAPOR DEPOSITION AND NANO-STRUCTURES," the disclosure of which is expressly incorporated by reference herein.

STATEMENT REGARDING FEDERALLY SPONSORED RESEARCH OR DEVELOPMENT

The invention described herein was made in the performance of official duties by employees of the Department of the Navy and may be manufactured, used and licensed by or for the U.S. Government for any governmental purpose without payment of any royalties thereon. This invention (Navy Case 102,541) is assigned to the U.S. Government and is available for licensing for commercial purposes. Licensing and technical inquiries may be directed to the Technology Transfer Office, Naval Surface Warfare Center Crane, email: Cran_CTO@navy.mil.

BACKGROUND AND SUMMARY OF THE INVENTION

The present invention relates to a process and apparatus for application of conformal coatings made up of nano-fiber, nano-particle, and/or nano-capsule materials to be applied on electrical component parts in general and printed circuit boards (PCB) in particular. Benefits of this invention include enhancement of conventional conformal coatings performance in terms of properties such as mechanical, electrical, magnetic and in particular to prevent/obstruct the growth of tin or any other manufacturing defect such as whisker structures through the conventional conformal coatings applied on the surface of electrical component parts in general and a PCB in particular.

Current types of conformal coatings as applied on PCBs are not able to prevent manufacturing defects or undesirable structures such as tin whiskers or any other whisker growth. Further, defects such as tin whiskers or any other whiskers that grow from the current conformal coating are not electrically insulating hence they create short circuits and failures by conducting undesired current through them.

An embodiment of the invention can be used to address undesirable structure formation by use of a process that can be used to deposit nano-fiber, nano-particle, or nano-capsule material on an electrical circuit component such as, for example, a PCB, with a novel process and apparatus which include chemical vapor deposition (CVD), physical vapor deposition (PVD), or hybrid physical-chemical vapor deposition (HPCVD) and Electro-spinning.

Additional features and advantages of the present invention will become apparent to those skilled in the art upon consideration of the following detailed description of the illustrative embodiment exemplifying the best mode of carrying out the invention as presently perceived.

BRIEF DESCRIPTION OF THE DRAWINGS

The detailed description of the drawings particularly refers to the accompanying figures in which.

DETAILED DESCRIPTION OF THE DRAWINGS

The embodiments of the invention described herein are not intended to be exhaustive or to limit the invention to precise forms disclosed. Rather, the embodiments selected for description have been chosen to enable one skilled in the art to practice the invention.

Electro-spinning can be used to generate nano-fiber, nano-particle, and/or nano-capsules of various morphologies, configurations and sizes. While a CVD, PVD, or HPCVD process can provide a conformal coating, it has not been used to produce a nano-coating with adequate attributes to reduce manufacturing defects that cause short circuits, e.g., whiskers. A CVD, PVD, or HPCVD process can be adapted to generate a uniform coating on a part surface (such as PCB) of a homogeneous material/polymer like Parylene, but conventional CVD, PVD, or HPCVD coating process have not been adapted to produce or operate in conjunction with another system which produces nano-fiber, nano-particle, nano-capsules, etc. as reinforcement to another material such as, for example, Parylene. On the other hand, an electro-spinning type process can be adapted to produce composite reinforcement structures such as nanofibers, nano-particles, nano-capsules, etc. but would be unable to produce a composite structure, having a matrix as well as reinforcement.

A composite material by definition has a matrix such as parylene and a reinforcement material such as nano-fibers, nanoparticles, nano-capsules, etc. Accordingly, an embodiment of the invention includes a process and apparatus adapted for combining a CVD, PVD, or HPCVD type and electro-spinning type processes (which provide matrix and reinforcements respectively), to produce a conformal coating on an electrical related part in general (and PCB in particular). This improved manufacturing apparatus and process thus generates a conformal nano-composite coating on any part surface in general and PCB in particular using an exemplary combination of CVD, PVD, or HPCVD, conformal coating polymer materials (acrylics, silicones, epoxies, Parylene, and urethanes), and a suitable type of nano-fiber, nano-particle, and/or nano-capsule in accordance with one or more embodiments of the invention.

One important advantage of this invention is that it would be possible to achieve conformal composite coating containing nano-fibers, nano-particles, nano-capsules, etc. in variety of polymer matrices with excellent mechanical, electrical, magnetic or a combination of properties. Further this invention would successfully mitigate or eliminate electrical component manufacturing defects such as, for example, tin whiskers or other types of undesirable structures. This invention can also produce bulk composite structures and parts for high tech applications.

Figure 1:
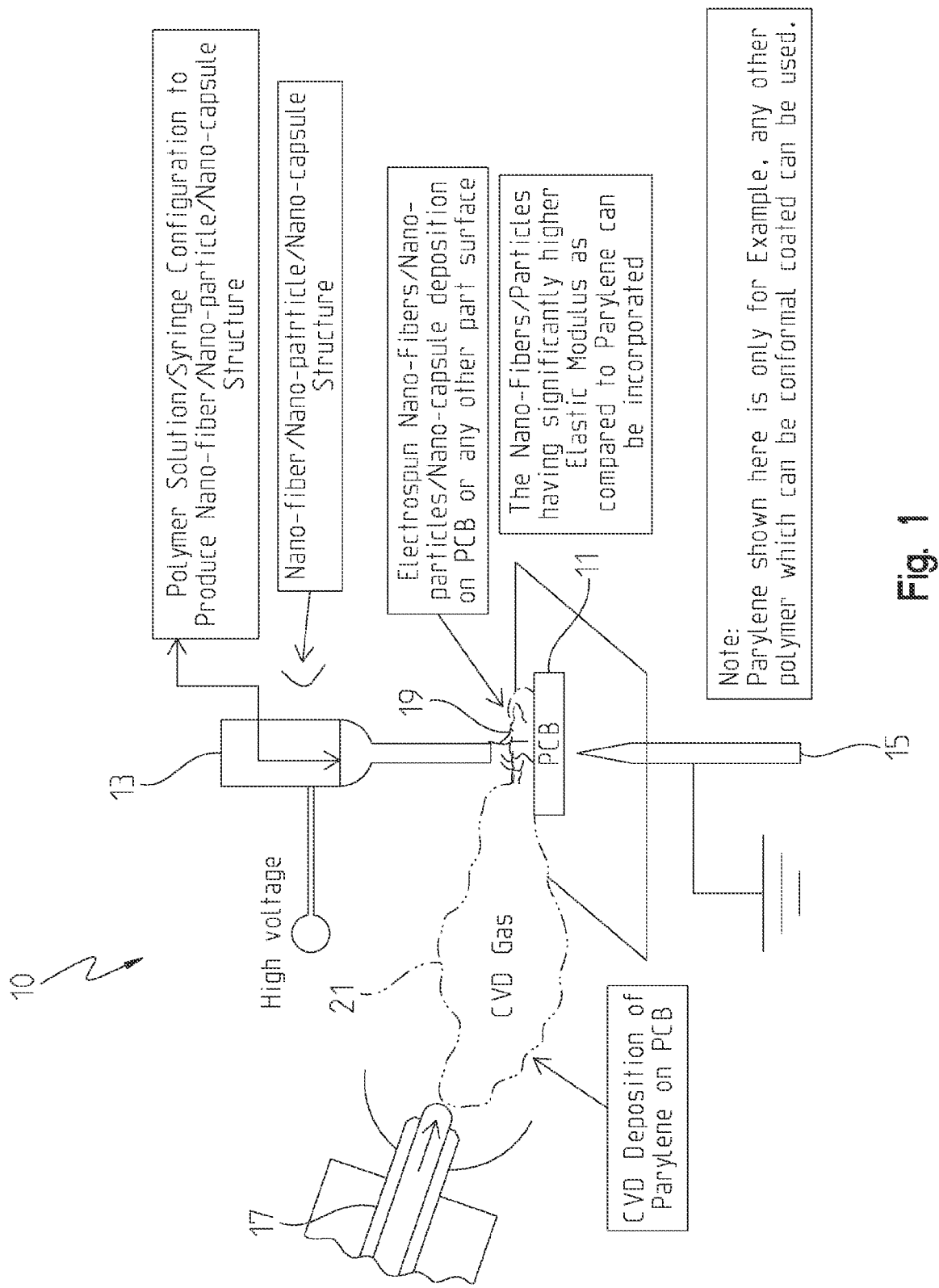
FIG. 1 is a diagram of a manufacturing process according to an illustrative embodiment of the invention.

Referring initially to FIG. 1, a PCB 11 is shown in a manufacturing process positioned between a nano-structure source 13 and a ground 15 where a CVD material source 17 is positioned to introduce a vapor 21, e.g., Parylene. An exemplary nano-structure producing system 10 creates desirable nano-structures 19. Desirable nano-structures can include nano-structures which provide a high elastic modulus which will prevent or restrain formation or protrusion of undesirable manufacturing defect structures that can arise during post CVD/nano-structure composite application such as whiskers. These nano-structures can include, for example, nano-fibers, nano-particles, or nano-capsules. Exemplary nano-structures can be produced using, for example, an electro-spun process or a force-spinning process which are deposited on the PCB 11. It should be noted that an electro-spinning process can be used with manufacturing processes where use of a high voltage source in the nano-structure formation is undesirable. The nano-structure source 13 and CVD source 17 are activated to begin deposition of chemical vapor 21 and the nano-structures discussed above wherein the CVD source and nano-structure source deposit the chemical vapor and nano-structures in a layering process where the CVD material and nano-structure composite layers that are adapted to produce a non-conductive mechanical barrier to stress generated, chemical interaction generated, or other types of extrusion or emergent manufacturing defects extruded or generated from the electrical component, e.g., PCB, including whiskers (e.g., tin whiskers).

A PCB can be located such as to avoid electric field induced damage, if required. A simultaneous exposure and coating of CVD vapor on a nano-structure composite would coat the nano-structure and deposit as a conformal nano-structure reinforced coating which is electrically insulated so as to avoid short-circuits.

Figure 2:
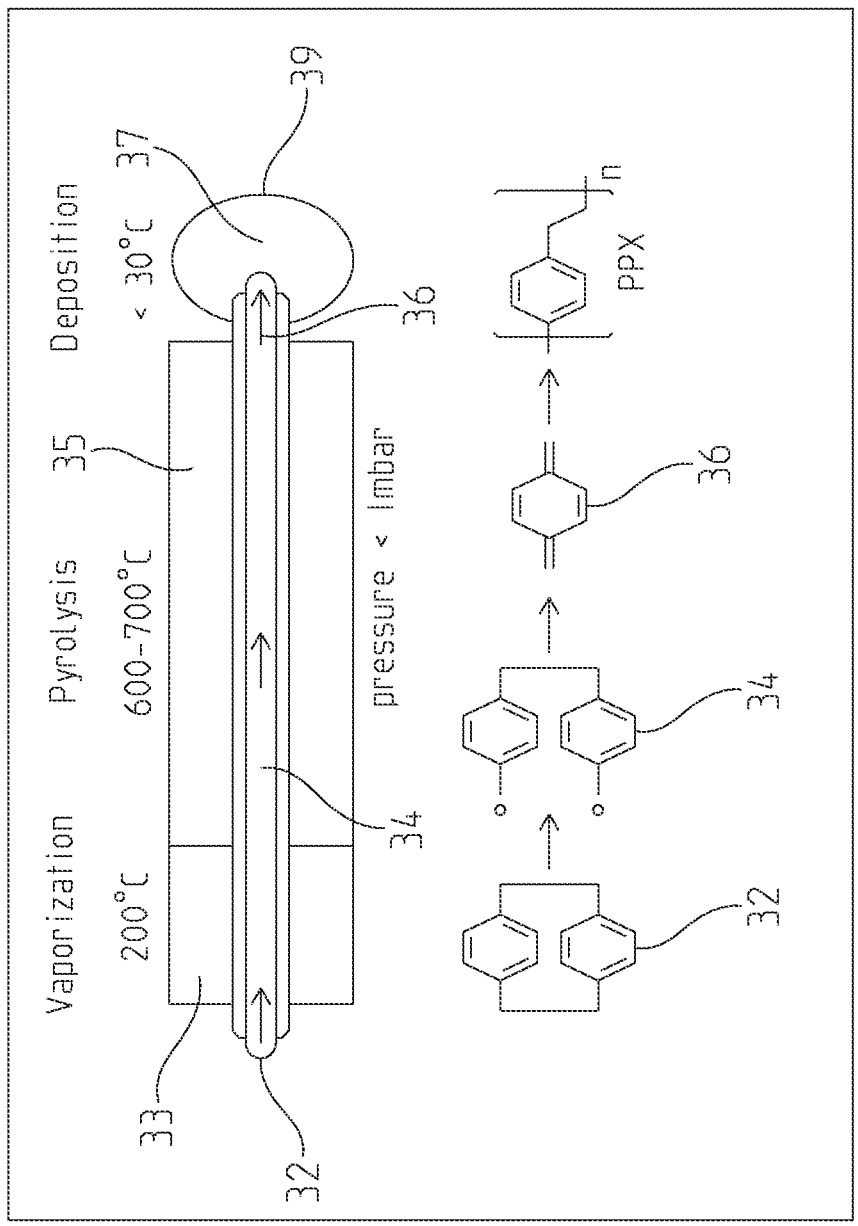
FIG. 2 is a diagram of a chemical vapor deposition process according to an illustrative embodiment of the invention.

Referring to FIG. 2, a CVD process is shown in accordance with one embodiment of the invention. CVD coatings are applied using specialized vacuum deposition equipment and the process requires heat. A chemical 32 is introduced to a low pressure system and heated such that it becomes a vaporized chemical 34 in a vaporization step 33. Next, in pyrolysis step 35, the vaporized chemical 34 is heated and goes through a thermochemical decomposition producing a chemical vapor 36. Finally, in deposition step 37, the temperature and pressure of the system is returned to a normal room type temperature and normal atmospheric pressure and chemical vapor 36 deposits on all surfaces of a target substrate 39, e.g., a PCB, as a polymer film. This type of coating process penetrates crevices and tight areas on multi-layer components providing a complete encapsulation of a component.

Figure 3:
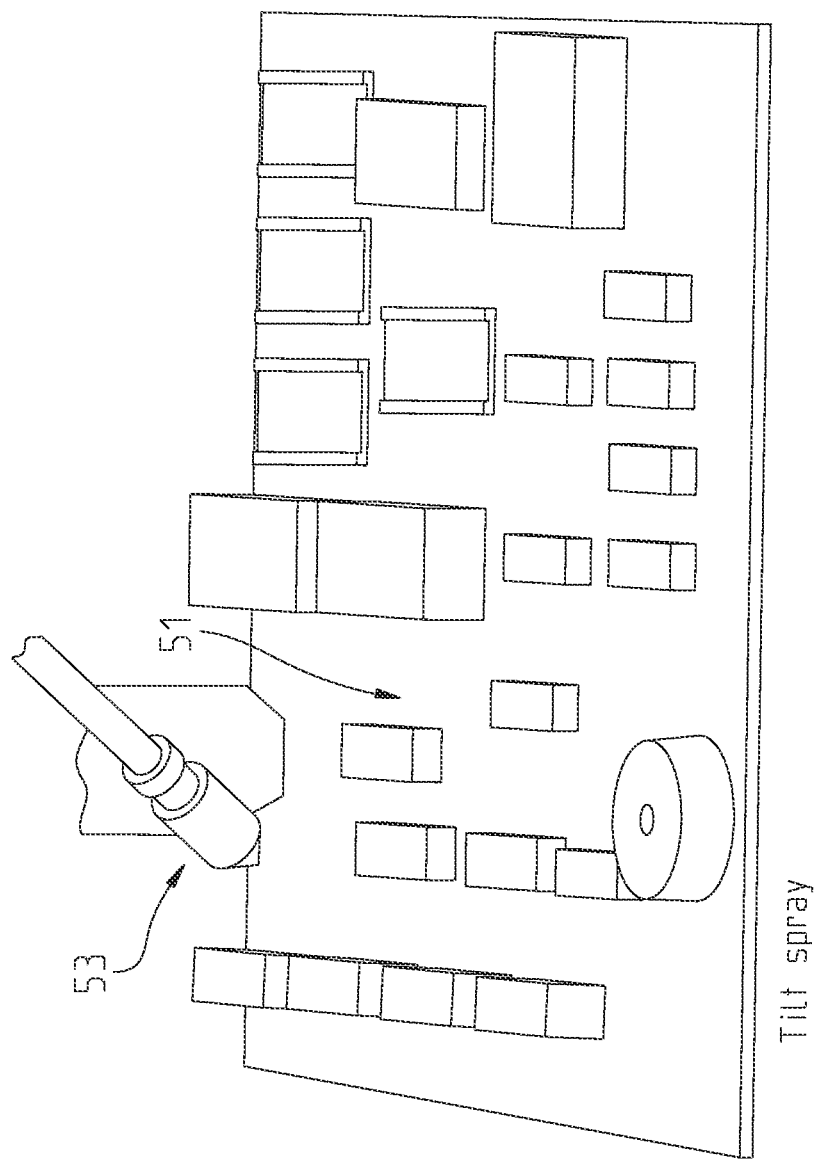
FIG. 3 is a diagram of a deposition process of a chemical vapor according to an illustrative embodiment of the invention.

Referring to FIG. 3, a diagram of a deposition of a chemical vapor, such as Parylene, being applied to an electrical component is shown. Electrical component 51 is positioned such that it is within the field of view of applicator 53. Applicator 53 further has the ability to tilt thus, causing a more complete and uniform coating of chemical vapor on electrical component 51.

Figure 4:
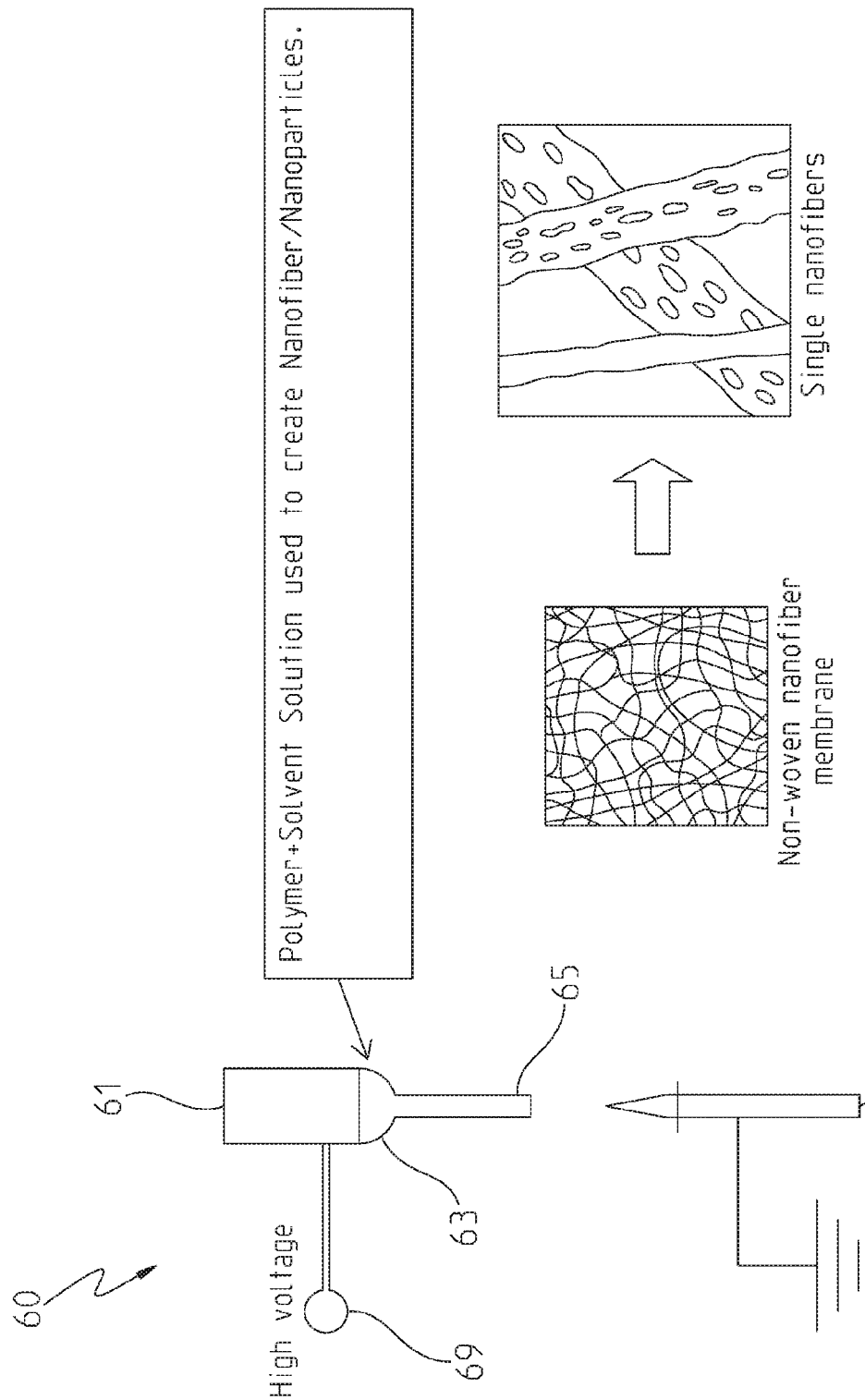
FIG. 4 is a diagram of an electro-spinning process according to an illustrative embodiment of the invention.

Referring to FIG. 4, a diagram of an electro-spinning process used to create nanofibers is shown. FIG. 4 shows the setup of an electro-spinner 60, comprising a syringe pump 61 that supplies a polymer solution 63 to a capillary 65 in order to create nanofibers, a metal ground 67, and a voltage source 69. A jet of polymer solution 63 is emitted from capillary 65 using a combination of syringe pump 61 and an electrical field strength produced by voltage source 69. When the electric field strength exceeds a certain high voltage, the jet of polymer solution 63 is emitted from the drop of polymer solution 63 in capillary 65. Polymer solution 63 is initially a liquid but it immediately begins to dry as a drop on the head of capillary 65 and it further dries as a jet of polymer solution 63 as the polymer is accelerated through the air. The jet of polymer solution 63 is effectively a solid by the time the jet makes contact with a metal ground 67 and thereby becomes a nanofiber. The nanofiber can create some type of coiling phenomenon upon contacting metal ground 67.

Figure 5:
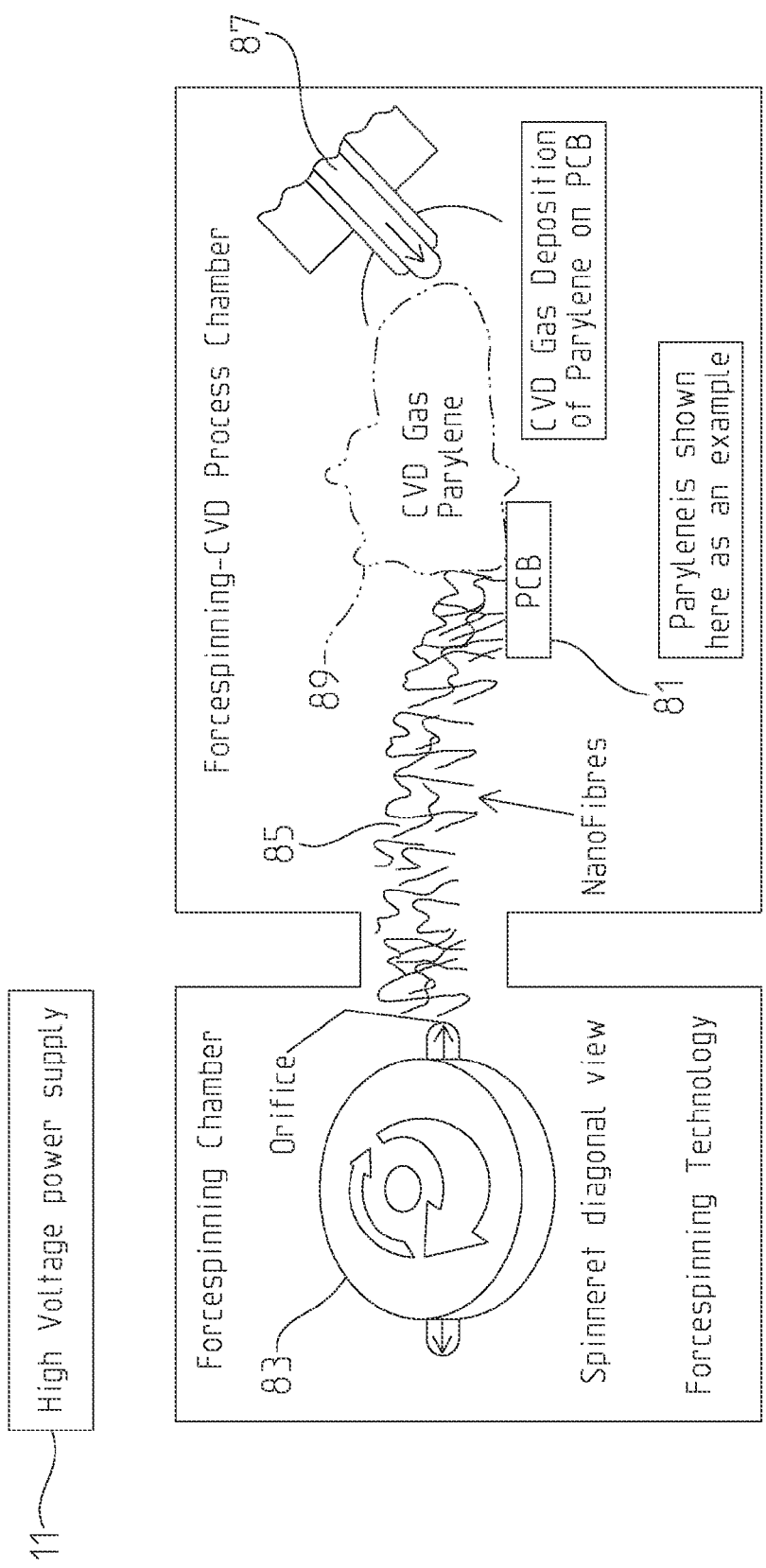
FIG. 5 is a diagram of a force-spinning process according to an illustrative embodiment of the invention.

Referring to FIG. 5, a force-spinning process is shown in accordance with one embodiment of the invention. In particular, an electrical device, such as PCB 81, is positioned in proximity to a force-spinning chamber 83 which acts as a nano-structure source, wherein the nano-structure source produces a nano material 85 such as nano-fibers, nano-capsules, or nano-particles having a high modulus of elasticity higher than a manufacturing defect (e.g., tin or other type of whiskers) which can form by, for example, stress or chemical interaction with electrical components in the electrical structure, e.g., PCB 81, which is being coated by the nano-structure and CVD, PVD, or HPCVD process. The force-spinning nano-structure source 83 and CVD, PVD, or HPCVD source 87 are activated to begin deposition of chemical vapor 89 and the nano-structures 85 discussed above wherein the CVD source and nano-structure source deposit the chemical vapor 89 and nano-structures 85 in a layering process where the CVD, PVD, or HPCVD material and nano-structure composite layers are designed to produce a non-conductive mechanical barrier to extrusion or emergence of manufacturing defects arising from the electrical component, e.g., PCB, such as described above.

Figure 6:
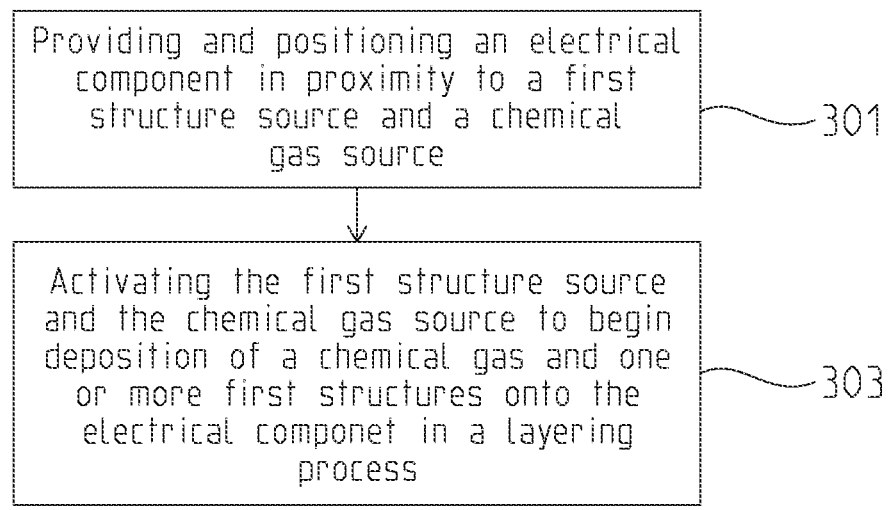
FIG. 6 is a diagram of a process of application of the invention according to an illustrative embodiment.

Referring to FIG. 6, a process for application of CVD, PVD, or HPCVD and suitable nano-structures is shown. At step 301, an electrical component is positioned, e.g., a PCB in proximity to a nano-structure source and a CVD, PVD, or HPCVD source, wherein the nano-structure source produces a nano material such as nano-fibers, nano-capsules, or nano-particles having a high modulus of elasticity higher than a manufacturing defect (e.g., tin or other type of whiskers) which can form by, for example, stress or chemical interaction with electrical components in the electrical structure, e.g., PCB 1, which is being coated by the nano-structure and CVD, PVD, or HPCVD process. At step 303, the nano-structure source and CVD, PVD, or HPCVD source are activated to begin deposition of chemical vapor and the nano-structures discussed above wherein the CVD, PVD, or HPCVD source and nano-structure source deposit the chemical vapor and nano-structures in a layering process where the CVD, PVD, or HPCVD material and nano-structure composite layers are designed to produce a non-conductive mechanical barrier to extrusion or emergence of manufacturing defects arising from the electrical component, e.g., PCB, such as described above.

Figure 7:
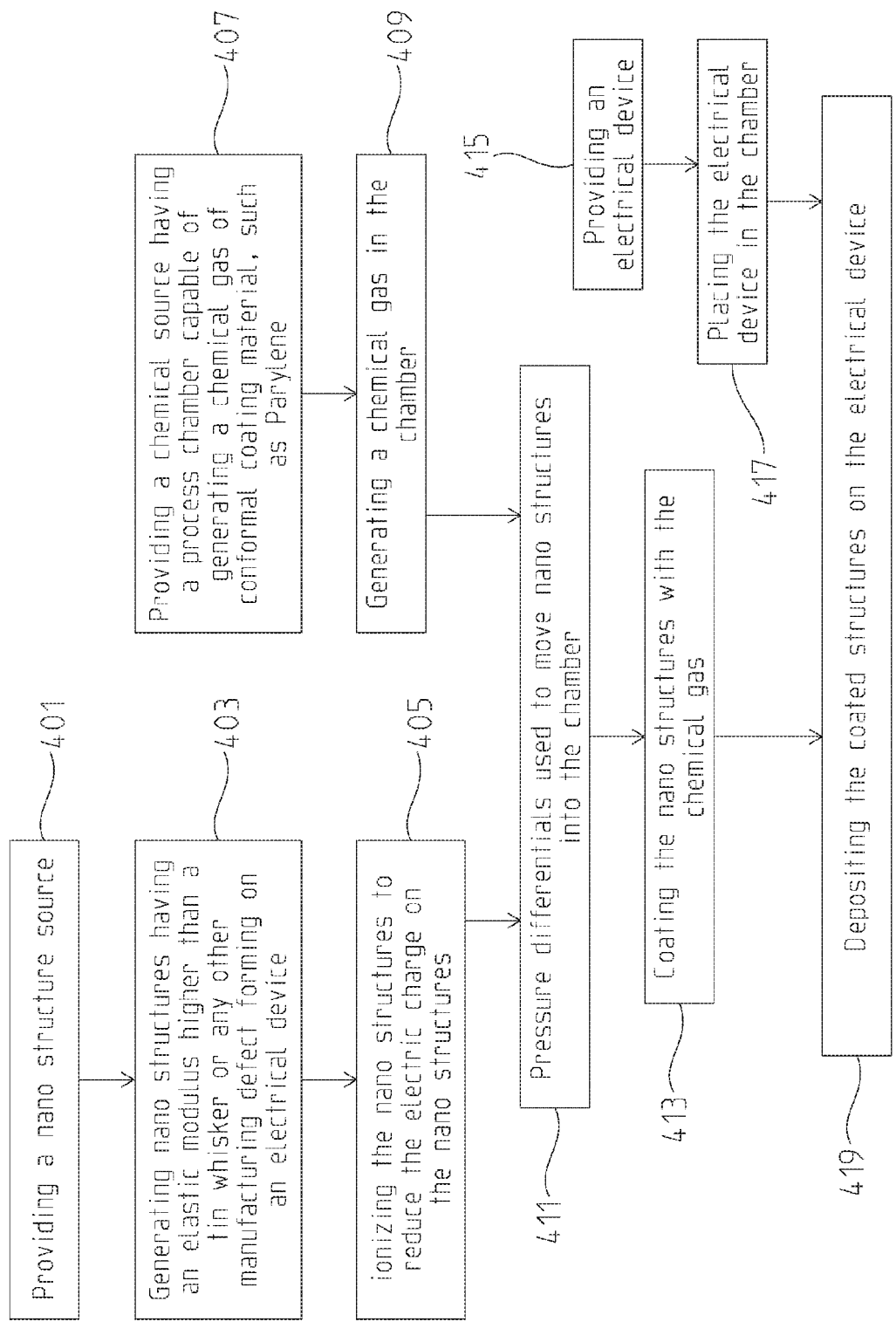
FIG. 7 is a block diagram of a process of application of the invention according to an illustrative embodiment.

Referring to FIG. 7, a process for generating and applying nano-structures and CVD, PVD, or HPCVD to a PCB is shown. In step 401, a nano structure source is provided, then in step 403, the nano structure source, e.g., an electro-spinner, a force-spinner, etc., is used to generate a polymer of nano-fibers incorporating nano-particles or nano-capsules of various morphologies, configurations, and sizes, having an elastic modulus higher than a tin whisker or any other manufacturing defect that can form on a PCB. Next, in step 405, the fibers are ionized to reduce the electric charge on the fibers. Meanwhile, in step 407, a chemical source having a process chamber capable of generating a chemical vapor of conformal coating material, e.g., Parylene, is provided, and in step 409 the chamber is used to generate the chemical vapor. In step 411, a pressure differential is used to move the fibers such that they are disposed into the chamber provided, and then in step 413, the fibers and vapor are mixed such that the fibers are coated with the CVD, PVD, or HPCVD vapor. In step 415, an electrical device, e.g. PCB, is provided, and then in step 417 the electrical device is placed in the chamber. Finally, the coated fibers are deposited on the electrical device.

Nano-materials which can be used with an exemplary embodiment of the invention include nano-ceramic materials such as zirconia or alumina. CVD, PVD, or HPCVD materials can also be selected to a suitable binder as well as a coating material which also provides other benefits such as non-corrosive attributes or prevention of oxidation of electrical component sections.

Nano-material selection can also provide additional benefits such as an indicator of defect generation such as selection of a material that has an electro-mechanical interaction with a defect such as a whisker. For example, a piezoelectric nano-material can be applied in a detection layer within insulated layers on the electrical component, such as zinc oxide, which can be used with an embodiment of the invention, which can be coupled with detection circuitry that detects an electric signal in the detection layer. Other detection nano-materials can be used, by themselves or in combination with other nano-materials, providing desired modulus of elasticity, which can exhibit observable indications, e.g., change color, when a mechanical stress from a generated manufacturing defect, e.g. a whisker, presses against the detection nano-material.

Although the invention has been described in detail with reference to certain preferred embodiments, variations and modifications exist within the spirit and scope of the invention as described and defined in the following claims.

The invention claimed is:

1. A method of manufacturing a composite conformal coating comprising the steps:
   providing an electrical component;
   providing a first structure source, wherein the first structure source is adapted to produce one or more first structures having a modulus of elasticity higher than a manufacturing defect of the electrical component, said manufacturing defect comprising one or more crystalline metallurgical phenomenon involving a conductive spontaneous growth structure;
   providing a chemical source that is adapted to produce a chemical vapor; and
   depositing the chemical vapor and the one or more first structures in a layering process on the electrical component such that the composite conformal coating is created, wherein the composite conformal coating forms a composite non-conductive mechanical barrier to extrusion or emergence of said manufacturing defect from the electrical component;
   wherein the one or more first structures comprise at least one nano-material selected from the group consisting of nano-fibers, nano-capsules, and nano-particles;
   wherein said at least one nano-material further comprises a material that exhibits an observable indication of physical interaction with said manufacturing defect, said material exhibiting the observable indication of physical interaction comprising a dye or structure which alters color or electromagnetic spectrum reflectivity or refraction when physically stressed.

2. A method of manufacturing a composite conformal coating as in claim 1, wherein the chemical vapor comprises Parylene.

3. A method of manufacturing a composite conformal coating as in claim 1, wherein the chemical source is adapted to operate in conjunction with the first structure source to generate the composite conformal coating in a uniform manner on a surface of the electrical component, the resulting formed composite conformal coating creating a barrier to a formation path or protrusion of the manufacturing defect.

4. A method of manufacture of manufacturing a composite conformal coating as in claim 1, wherein the chemical source is adapted to operate in conjunction with the first structure source to generate the composite conformal coating, wherein the composite conformal coating comprises said at least one nano-material in a polymer matrix with a predetermined mechanical, electrical, and/or magnetic property such that said composite conformal coating provides a barrier to an electrical component short-circuit created by formation or protrusion of said manufacturing defect.

5. A method of manufacturing a composite conformal coating as in claim 1, wherein said manufacturing defect comprises a tin whisker.

6. A method of manufacturing a composite conformal coating as in claim 1, wherein the first structure source is a force-spinner.

7. A method of manufacturing a composite conformal coating as in claim 1, wherein said electrical component comprises a plurality of electrical elements on a circuit board.

8. A method of manufacturing a composite conformal coating as in claim 1, wherein the at least one nano-material is at least one piezo-electric material.

9. A method of manufacturing a composite conformal coating comprising the steps:
   providing an electrical component;
   providing a first structure source, wherein the first structure source is adapted to produce one or more first structures having a modulus of elasticity higher than a manufacturing defect of the electrical component, said manufacturing defect comprising one or more crystalline metallurgical phenomenon involving a conductive spontaneous growth structure;
   providing a chemical source that is adapted to produce a chemical vapor; and
   depositing the chemical vapor and the one or more first structures in a layering process on the electrical component such that the composite conformal coating is created, wherein the composite conformal coating forms a composite non-conductive mechanical barrier to extrusion or emergence of said manufacturing defect from the electrical component;
   wherein the one or more first structures comprise at least one nano-material selected from the group consisting of nano-fibers, nano-capsules, and nano-particles;
   wherein the first structure source is an electro-spinner that is adapted to produce said at least one nano-material.

10. A method of manufacturing a composite conformal coating as in claim 9, wherein said electrical component comprises a plurality of electrical elements on a circuit board.

11. A method of manufacturing a composite conformal coating as in claim 9, wherein the at least one nano-material is at least one piezo-electric material.

12. A method of manufacturing a composite conformal coating comprising the steps:
   providing an electrical component;
   providing a first structure source, wherein the first structure source is adapted to produce one or more first structures having a modulus of elasticity higher than a manufacturing defect of the electrical component, said manufacturing defect comprising one or more crystalline metallurgical phenomenon involving a conductive spontaneous growth structure which is produced from a portion of said electrical component and said manufacturing defect being caused by physical stress or compressive stress;

providing a chemical source that is adapted to produce a chemical vapor in a process chamber;

placing the electrical component in the chamber;

producing said one or more first structures;

ionizing the one or more first structures to reduce an electrical charge on the one or more first structures;

generating the chemical vapor in the chamber;

disposing the one or more first structures in the process chamber by injecting the one or more first structure into the process chamber with air;

coating the one or more first structures with the chemical vapor such that a composite material is created as one or more coated first structures; and depositing the one or more coated first structures on the electrical component to create said composite conformal coating, wherein said composite material is adhered to the electrical component and said composite conformal coating mitigates creation of the manufacturing defect;

wherein the one or more first structures comprise at least one nano-material selected from the group consisting of nano-fibers, nano-capsules, and nano-particles.

13. A method of manufacturing a composite conformal coating as in claim 12, wherein said at least one nano-material further comprises at least one material that exhibits at least one observable indication of physical interaction with said manufacturing defect, said at least one material exhibiting the at least one observable indication of physical interaction comprising a dye or structure which alters color or electromagnetic spectrum reflectivity or refraction when physically stressed.

14. A method of manufacturing a composite conformal coating as in claim 12, wherein the chemical vapor comprises Parylene.

15. A method of manufacturing a composite conformal coating as in claim 12, wherein the first structure source comprises an electro-spinner that is adapted to produce said at least one nano-material in one or more morphologies, configurations, and sizes.

16. A method of manufacturing a composite conformal coating as in claim 12, wherein the chemical source is adapted to operate in conjunction with the first structure source to generate the composite conformal coating in a uniform manner on a surface of the electrical component, the resulting formed composite conformal coating being adapted to mitigate creation of the manufacturing defect.

17. A method of manufacturing a composite conformal coating as in claim 12, wherein the chemical source is adapted to operate in conjunction with the first structure source to generate the composite conformal coating, wherein the composite conformal coating comprises said at least one nano-material in a polymer matrix.

18. A method of manufacturing a composite conformal coating as in claim 12, wherein the first structure source is a force-spinner.

19. A method of manufacturing a composite conformal coating as in claim 12, wherein said electrical component comprises a plurality of electrical elements on a circuit board.

20. A method of manufacturing a composite conformal coating as in claim 12, wherein the at least one nano-material is at least one piezo-electric material.

\* \* \* \* \*